(12) United States Patent
Takakusaki

(10) Patent No.: US 11,101,139 B2
(45) Date of Patent: Aug. 24, 2021

(54) ETCHED NICKEL PLATED SUBSTRATE AND RELATED METHODS

(71) Applicant: SEMICONDUCTOR COMPONENTS INDUSTRIES, LLC, Phoenix, AZ (US)

(72) Inventor: Sadamichi Takakusaki, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/502,482

(22) Filed: Jul. 3, 2019

(65) Prior Publication Data

US 2020/0365415 A1 Nov. 19, 2020

Related U.S. Application Data

(60) Provisional application No. 62/848,182, filed on May 15, 2019.

(51) Int. Cl.
*H01L 21/3213* (2006.01)
*H01L 21/02* (2006.01)

(52) U.S. Cl.
CPC .. *H01L 21/32134* (2013.01); *H01L 21/02194* (2013.01); *H01L 21/02628* (2013.01)

(58) Field of Classification Search
CPC ......... H01L 21/32134; H01L 21/67023; H01L 21/67075–67086
See application file for complete search history.

(56) References Cited

U.S. PATENT DOCUMENTS

| | | | |
|---|---|---|---|
| 9,935,043 B1* | 4/2018 | Imafuji | H01L 23/3185 |
| 2011/0293960 A1* | 12/2011 | Yamanishi | C23C 22/05 |
| | | | 428/607 |
| 2015/0216056 A1 | 7/2015 | Teshima et al. | |
| 2019/0239357 A1* | 8/2019 | Klocek | C23F 1/16 |

* cited by examiner

*Primary Examiner* — Jonathan Han
(74) *Attorney, Agent, or Firm* — Adam R. Stephenson, Ltd.

(57) ABSTRACT

An etched nickel plated substrate and related methods is disclosed. Specific implementations may include providing a dielectric layer, coupling a layer of copper with a first side of the dielectric layer, plating a first side of the layer of copper with a layer of nickel; forming a patterned layer on the layer of nickel, and spray etching the layer of nickel using an etchant. The method may include holding the etchant on the dielectric layer for a predetermined period of time, and while holding the etchant, etching substantially only the layer of nickel until the layer of nickel may be substantially coextensive with a perimeter of each of a plurality of traces in the layer of copper.

15 Claims, 5 Drawing Sheets

ETCHED NICKEL PLATED SUBSTRATE AND RELATED METHODS

CROSS REFERENCE TO RELATED APPLICATIONS

This application claims the benefit of the filing date of U.S. Provisional Patent Application 62/848,182, entitled "ETCHED NICKEL PLATED SUBSTRATE AND RELATED METHODS" to Takakusaki et al., which was filed on May 15, 2019, the disclosure of which is hereby incorporated entirely herein by reference.

BACKGROUND

1. Technical Field

Aspects of this document relate generally to semiconductor substrates, such as those plated with various metals.

2. Background

A semiconductor substrate may be electroplated, or electroless plated, with various metals. Semiconductor substrates with various metals thereon are used to route signals and power among various semiconductor devices and passive components coupled thereto.

SUMMARY

Implementations of a method of etching nickel on a substrate may include: providing a dielectric layer; coupling a layer of copper with a first side of the dielectric layer; plating a first side of the layer of copper with a layer of nickel; forming a patterned layer on the layer of nickel; and spray etching the layer of nickel using an etchant. The method may also include holding the etchant on the dielectric layer for a predetermined period of time; and while holding the etchant, etching substantially only the layer of nickel until the layer of nickel may be substantially coextensive with a perimeter of each of a plurality of traces in the layer of copper.

Implementations of a method of etching nickel on a substrate may include one, all, or any of the following:

The etchant may include ferric chloride.

The predetermined period of time may be within a range of 60 seconds to 90 seconds.

The layer of nickel may include electroless nickel.

The patterned layer may be formed by screen print, stencil, or photo resist.

Holding the etchant may also include holding the etchant at a temperature within a range of 43 degrees Celsius to 47 degrees Celsius.

Spray etching the layer of nickel may also include spraying the etchant at a pressure within a range of 220 kilopascals to 280 kilopascals.

The layer of nickel may have a thickness within a range of 1 micrometer to 7 micrometers, and the layer of copper may have a thickness within a range of 70 micrometers to 1,000 micrometers.

The method may also include stripping the patterned layer.

Implementations of a method of etching nickel on a substrate may include: providing a dielectric layer; coupling a layer of copper with a first side of the dielectric layer; plating a first side of the layer of copper with a layer of nickel; forming a patterned layer on the layer of nickel; and spray etching the layer of nickel using an etchant. The method may also include holding the etchant on the dielectric layer for a predetermined period of time, the predetermined period of time within a range of 60 seconds to 90 seconds; and while holding the etchant, etching substantially only the layer of nickel until the layer of nickel may be substantially coextensive with a perimeter of each of a plurality of traces in the layer of copper.

Implementations of a method of etching nickel on a substrate may include one, all, or any of the following:

The etchant may include ferric chloride.

The patterned layer may be formed by screen print, stencil, or photo resist.

Holding the etchant may also include holding the etchant at a temperature within a range of 43 degrees Celsius to 47 degrees Celsius.

Spray etching the layer of nickel may also include spraying the etchant at a pressure within a range of 220 kilopascals to 280 kilopascals.

The layer of nickel may have a thickness within a range of 1 micrometer to 7 micrometers, and the layer of copper may have a thickness within a range of 70 micrometers to 1,000 micrometers.

Implementations of a semiconductor substrate may include: a dielectric layer; a layer of copper coupled to a first side of the dielectric layer, where the layer of copper may include one or more traces formed therein. Each trace of the one or more traces may include a perimeter and a layer of nickel coupled onto a side of the layer of copper opposite the dielectric layer; where the layer of nickel may not substantially overhang the perimeter of each trace of the one or more traces.

Implementations of a method of etching nickel on a substrate may include one, all, or any of the following:

A patterned layer on the layer of nickel.

The layer of nickel may have a thickness within a range of 1 micrometer to 7 micrometers.

The layer of copper may have a thickness within a range of 70 micrometers to 1,000 micrometers.

The layer of nickel may have been spray etched with an etchant, the etchant held to etch substantially only the layer of nickel.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended etched nickel plated substrate will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such etched nickel plated substrates, and implementing components and methods, consistent with the intended operation and methods.

Figure 1:
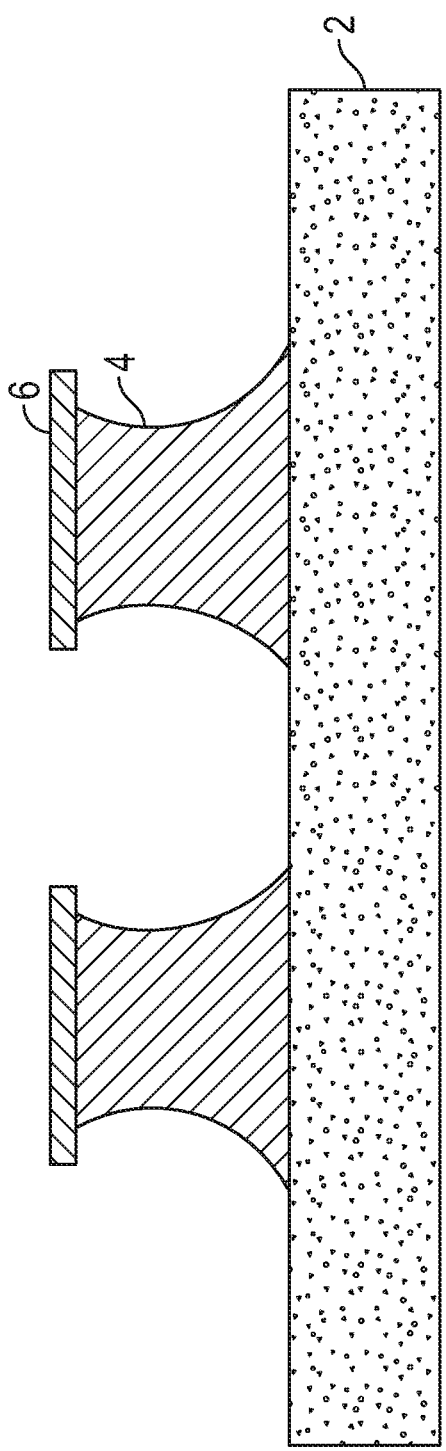
FIG. 1 illustrates a cross-sectional view of a semiconductor substrate with a layer of nickel that overhangs a layer of copper.

Referring to FIG. 1, a cross-sectional view of a substrate with a layer of nickel that overhangs a layer of copper traces 4 is illustrated. Generally, with various spray etching techniques, a layer of copper is coupled to a dielectric layer 2, or other substrate type. A layer of nickel 6 is then coupled to the layer of copper. In various implementations, a patterning layer is then coupled over the layer of nickel and the copper is then wet etched using an isotropic process. Because of the isotropic nature of the etch, as this etching occurs, the etchant will cause undercutting of the upper surface as the etchant etches the bulk copper material faster than nickel layer material. In such implementations, following the etching of the copper to form traces 4, a layer of nickel 6 remains on the surface of each trace 4 that opposes the surface of the trace coupled with the dielectric layer 2, as illustrated. The spray etchant is rinsed, or otherwise removed, from the system immediately after application. As illustrated, in this process, an overhang of the layer of nickel 6 is left behind as a result of the slower etch rate of the nickel compared with the copper. As illustrated, the circumference of the layer of nickel 6 is therefore greater than the circumference of the copper traces 4 themselves when viewed looking down on the nickel layer over the traces 4. The overhang of nickel may occur more frequently in implementations where a thicker layer of copper is used. This overhang of nickel may then cause circuit failure if it breaks off during subsequent stages in production as it has the potential to create electrical shorting between the traces and other defects.

Figure 2:
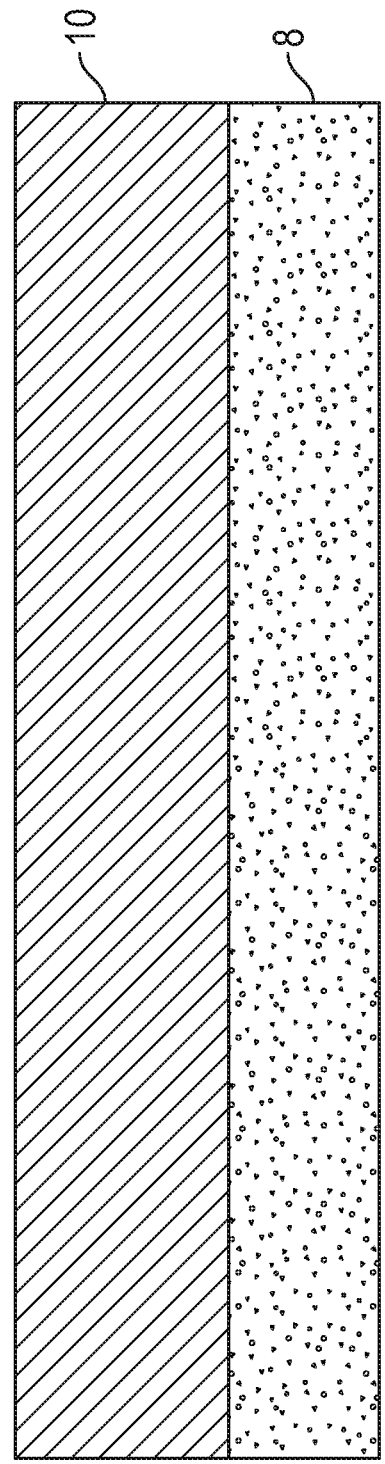
FIG. 2 illustrates a cross-sectional view of a semiconductor substrate with a layer of copper coupled to a dielectric layer.

Referring to FIG. 2, a cross-sectional view of a substrate with a layer of copper 10 coupled to a dielectric layer 8 is illustrated. Beginning in FIG. 2, another implementation of a method of etching nickel on a substrate is illustrated after various steps of the process have been completed. Similar to the process illustrated in FIG. 1, the method implementation begins with a layer of copper 10 being coupled to a dielectric layer 8 using various methods. In various implementations, by non-limiting example, the layer of copper 10 may be between about 70 micrometers and about 1,000 micrometers in thickness. In various implementations, the layer of copper 10 may be coupled to the dielectric layer 8 using multiple methods of formation. In some implementations, by non-limiting example, the layer of copper 10 may be placed on the dielectric layer 8 as a foil on either side and then sintered in a sintering oven to form a direct bond copper (DBC) substrate. Alternatively, the layer of copper 10 may be brazed onto the dielectric layer 8 such as when the substrate is formed using an active metal brazing (AMB) process. In still another implementation, the layer of copper 10 may be laminated onto/into the dielectric layer 8 using a lamination process to form a substrate like a board (PCB) substrate. In various implementations, by non-limiting example, the substrates, or dielectric layers, may alternatively be any of wide variety of substrate types, including by non-limiting example an aluminum nitride (AlN) substrate, a laminatable dielectric material, a glass reinforced epoxy laminate, a ceramic layer, and any other dielectric type capable of having die and other components coupled thereto.

Figure 3:
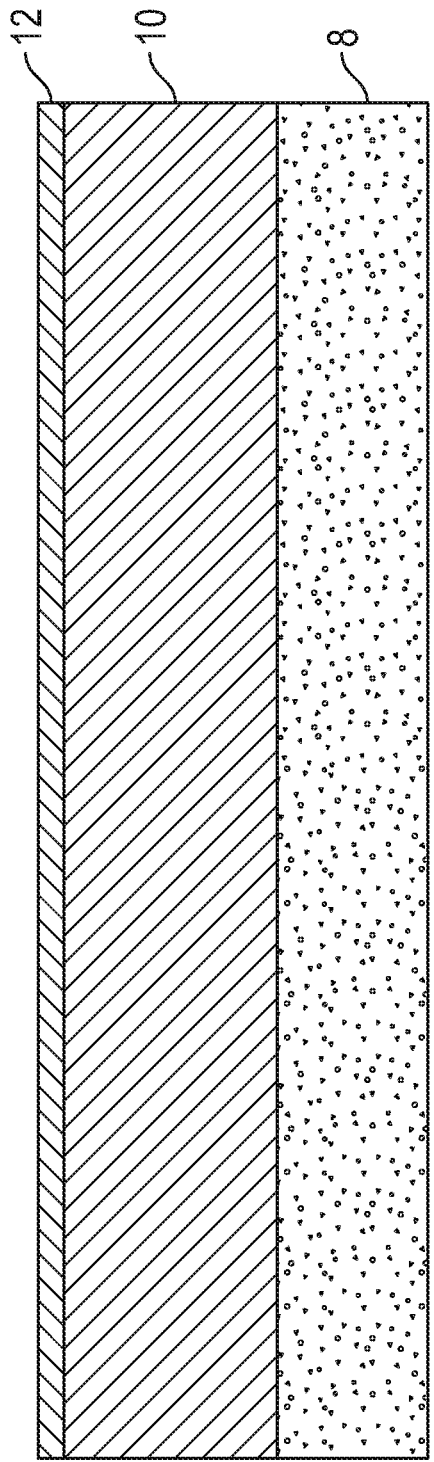
FIG. 3 illustrates a cross-sectional view of a semiconductor substrate with a layer of nickel coupled to the layer of copper.

Referring to FIG. 3, a cross-sectional view of a substrate following the coupling of a layer of nickel to the layer of copper is illustrated. As illustrated, a layer of nickel 12 is coupled to the layer of copper 10, which is coupled to the dielectric layer 8. The nickel may be coupled in a wide variety of methods. In particular implementations, the layer of nickel 12 may be electroplated to the layer of copper 10. In other implementations, the nickel 12 may be electrolessly plated to the layer of copper 10, in an autocatalytic reaction that allows for the deposit of a substantially even layer of nickel onto a surface, such as the layer of copper 10, another solid material, or a substrate. In those implementations where electroless plating is used, the electroless plating of the layer of nickel 12 may prevent corrosion and wear during operation of the semiconductor package that employs the traces. In other various implementations, by non-limiting example, the layer of nickel 12 may be between about 1 micrometer and about 7 micrometers in thickness.

Figure 4:
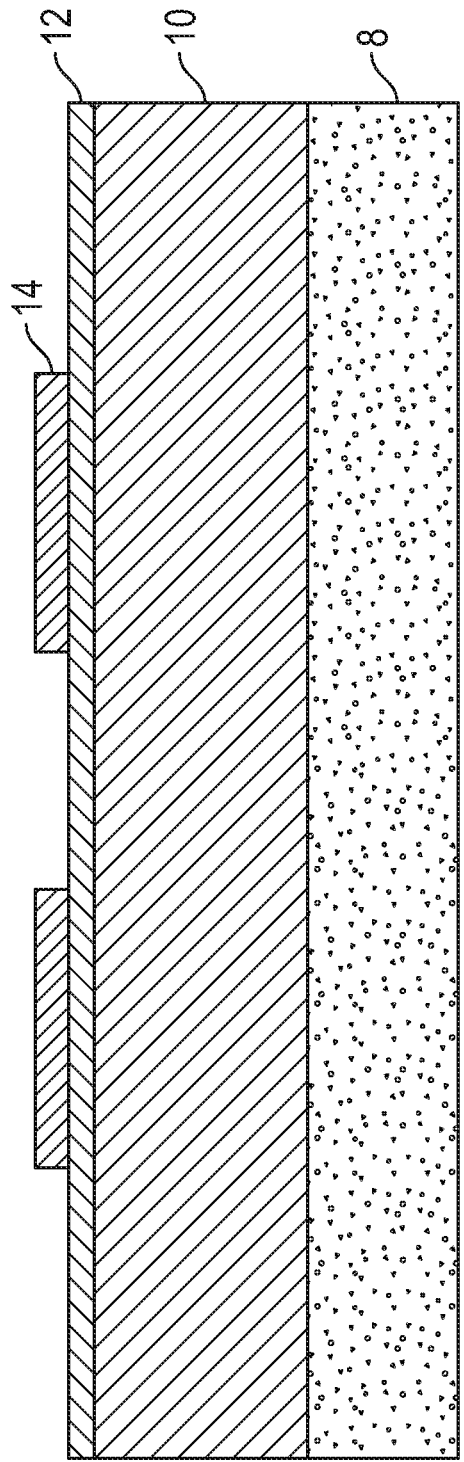
FIG. 4 illustrates a cross-sectional view of a semiconductor substrate with a patterned layer coupled to the layer of nickel.

Referring to FIG. 4, a cross-sectional view of a semiconductor substrate following coupling/forming a patterned layer 14 onto the layer of nickel 12 is illustrated. As illustrated, the layer of nickel 12 is coupled to layer of copper 10, which is coupled to the dielectric layer 8. As illustrated, a patterned layer 14 is formed on the layer of nickel 12 in preparation for etching. In various implementations, the patterned layer 14 may be formed by a variety of methods, including, by non-limiting example, a screen printing process, a stenciling process, photolithographic process, a contact photolithographic process, or any other patterning or lithographic process. Where a photolithographic process is used, the material of the patterned layer 14 may be a photoresist material that contains a polymer and/or resin material.

Figure 5:
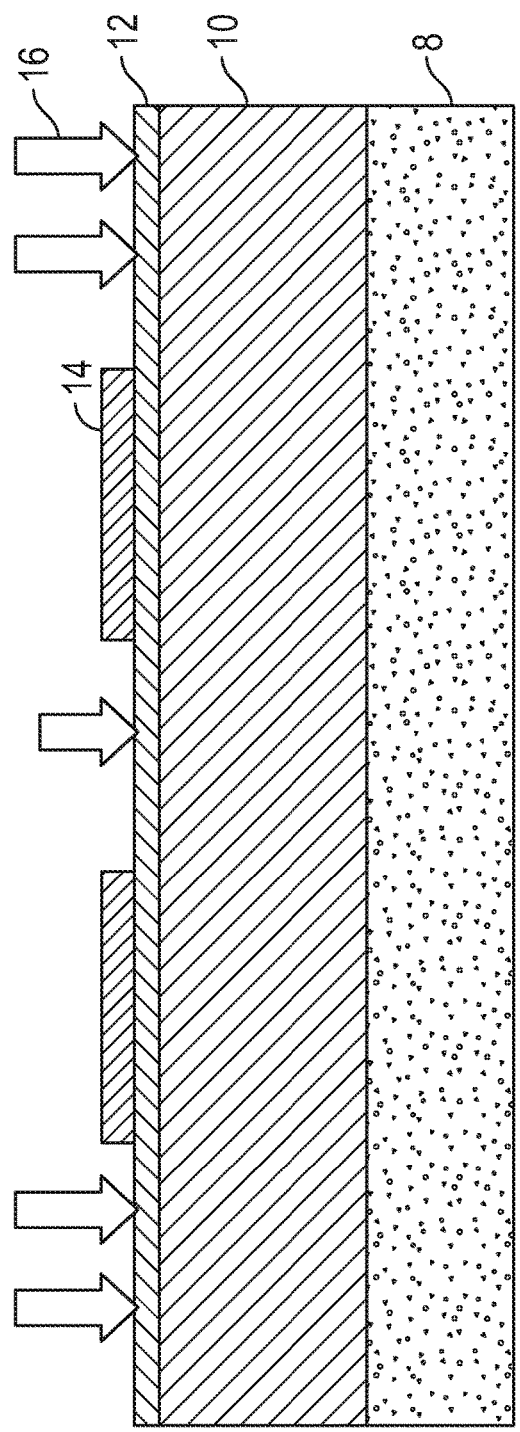
FIG. 5 illustrates a cross-sectional view of a semiconductor substrate as it is spray etched with an etchant.

Referring to FIG. 5, a cross-sectional view of a substrate as it is spray etched with an etchant 16 is illustrated. As illustrated, the patterned layer 14 is coupled to the layer of nickel 12, which is coupled to the layer of copper 10. As illustrated, the layer of copper 10 is coupled to the dielectric layer 8. As illustrated, the etchant 16 is sprayed onto the system in the direction of the arrows. In other various implementations, the etchant may be sprayed, or otherwise uniformly dispensed, onto the system in any direction or group of directions. In various implementations, the etchant may be sprayed or dispensed onto the substrate using a spraying pressure of between about 220 kilopascals to about 280 kilopascals. In various implementations, the etchant may include ferric chloride. In such implementations, the ferric chloride reacts with the copper and the nickel to etch both materials simultaneously. In various implementations, the chemical reaction between the etchant and the system can be represented by the equations: $Cu+2FeCl_3 \rightarrow CuCl_2+2FeCl_2$, representing the etchant's reaction with the copper, and $Ni+2FeCl_3 \rightarrow NiCl_2+2FeCl_2$, representing the etchant's reaction with the nickel. Note that the stoichiometry of both reactions is the same—a single Cu or Ni to two $FeCl_3$ meaning that in an excess of ferric chloride the reactions would proceed at the same rate if the activation energy/reaction kinetics of both reactions was the same. However it is evident from the structures in FIG. 1 and FIG. 6 that the activation energy/reaction kinetics for the reaction with nickel is much higher/more complex as the thinner layer of nickel etches at a comparatively slow rate compared with the copper material. Accordingly, one would expect that since the reaction stoichiometry is the same and the activation energy/reaction kinetics for nickel promote a slower reaction with the etchant, the copper would always preferentially etch versus the nickel at any concentration of ferric chloride in the etchant.

Figure 6:
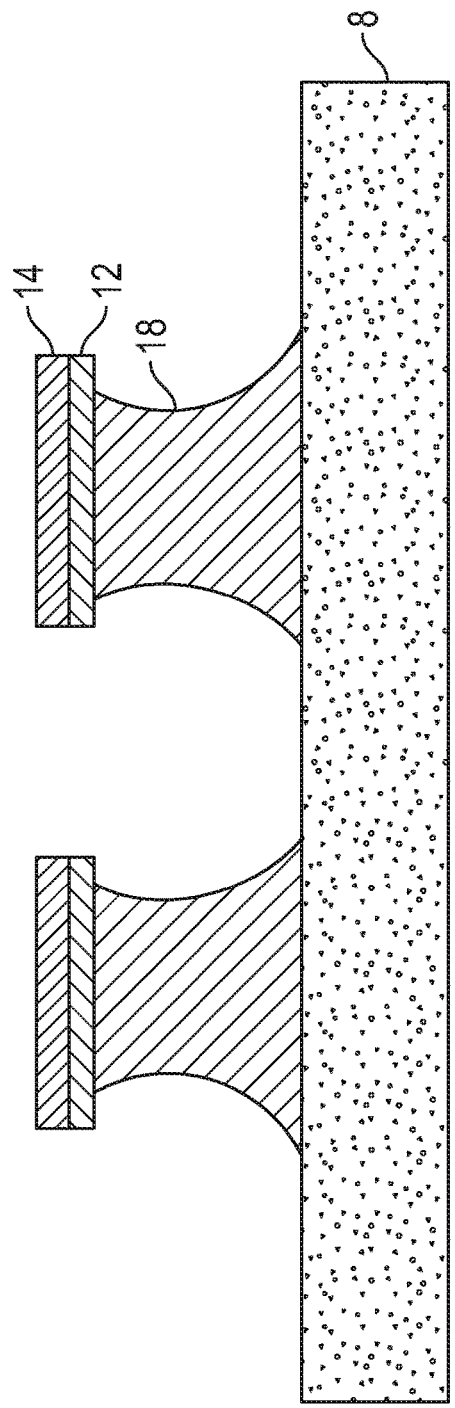
FIG. 6 illustrates a cross-sectional view of a semiconductor substrate after the layer of copper and layer of nickel have been spray etched.

Referring to FIG. 6, a cross-sectional view of a semiconductor substrate after the layer of copper and layer of nickel 12 without the etchant in place following etching through the copper layer to the dielectric layer 8 is illustrated. While the etchant is not shown in FIG. 6, in various method implementations, the etchant yet remains on the surface of the dielectric at this point in the process. As illustrated, the layer of copper has been etched to form a number of traces 18, each trace 18 having nickel layer 12 plated thereon. In various implementations, each trace 18 has a perimeter when viewed looking down on the trace 18 on the nickel layer 12. In various implementations, the perimeter does not form a single closed shape, the perimeter can alternatively be an unclosed shape. The shape of the perimeter is determined by the pattern of the traces 18 formed during the etching process. As illustrated, at this stage in the method/reaction with the etchant, the nickel layer 12 still overhangs the perimeter of the traces 18 of copper after the copper has been etched. As illustrated, following etching the traces 18 of copper are coupled to the dielectric layer 8, and a patterned layer 14 is still coupled to the layer of nickel 12. Because the patterned layer 14 is still coupled over the layer of nickel 12, the surface area of the nickel layer 12 is much less than the surface area of the copper traces 18 at this point in the reaction.

Figure 7:
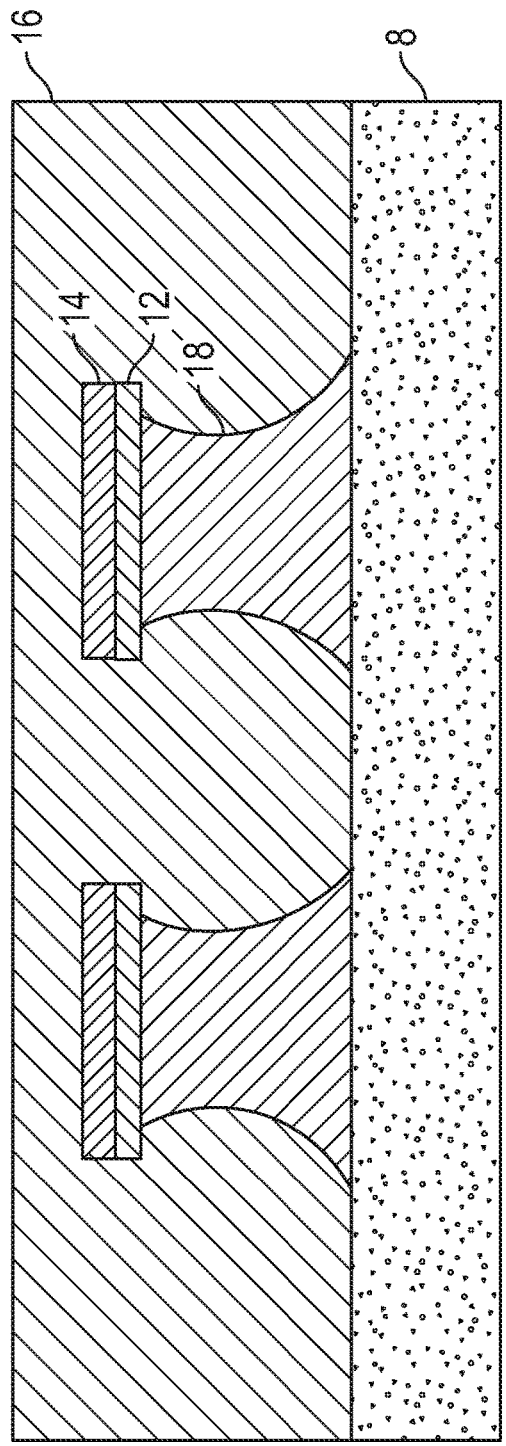
FIG. 7 illustrates a cross-sectional view of a semiconductor substrate as the etchant is held on the dielectric layer for a predetermined period of time.

Referring to FIG. 7, a cross-sectional view of a semiconductor substrate during holding of the spray etchant 16 on the surface of dielectric layer 8 for a predetermined period of time is illustrated. FIG. 7 illustrates how, in method implementations, the etchant 16 is sprayed onto the system, and then is held in place on the system in the form of a puddle/layer over the substrate's surface, so that the chemical reaction with the etchant can continue to progress. In such implementations, the system may include the patterned layer 14 coupled to the layer of nickel 12, which is coupled to the traces 18 of copper, which are coupled to the dielectric layer 8. In various implementations, the etchant is held on the system in an environment that provides a temperature within a range of about 43 degrees Celsius to about 47 degrees Celsius. The concentration of ferric chloride in the etchant may range from between about 0.4 mol/L to about 0.6 mol/L. in various implementations. In various implementations, by non-limiting example, the etchant is held in place as a puddle/layer for a predetermined period of time between about 60 seconds and about 90 seconds. In such implementations, the predetermined period of time may be referred to as a holding time. During the holding time, the etchant is held in place in the form of a puddle/layer. The use of a holding time with spray etching contrasts with the holding time used in a dunk tank/etching bath process as a dunk tank/etching bath normally always provides an excess of etchant chemical.

During the holding time, since the total quantity of etchant in the puddle/layer on the substrate is not replenished, the instantaneous concentration of ferric chloride in the puddle/layer drops during the holding time as the etching of the nickel and copper proceeds. Unexpectedly, it has been observed that following the holding time and rinsing of the etchant, the structure illustrated in FIG. 8 results where the nickel layer 12 no longer substantially overlaps the perimeter of the copper traces 18. Without being bound by any theory, it appears that during the holding time, the concentration of ferric chloride drops to a level that the reaction rate of the etchant with the copper reaches substantial equilibrium compared with the reaction rate with the nickel allowing the etchant continues to react preferentially with the nickel. This preferential reaction with nickel during the holding time is an unexpected result, given that the reaction stoichiometry between ferric chloride and copper and nickel is the same and the activation energy/reaction kinetics favor reaction with copper over nickel. This result is also unexpected in view of the relatively low surface area available for nickel reaction compared with the surface of area of copper on the copper traces. Through use of the holding time, any overhang in the nickel, may be substantially prevented/eliminated through the preferential etching of the nickel.

Figure 8:
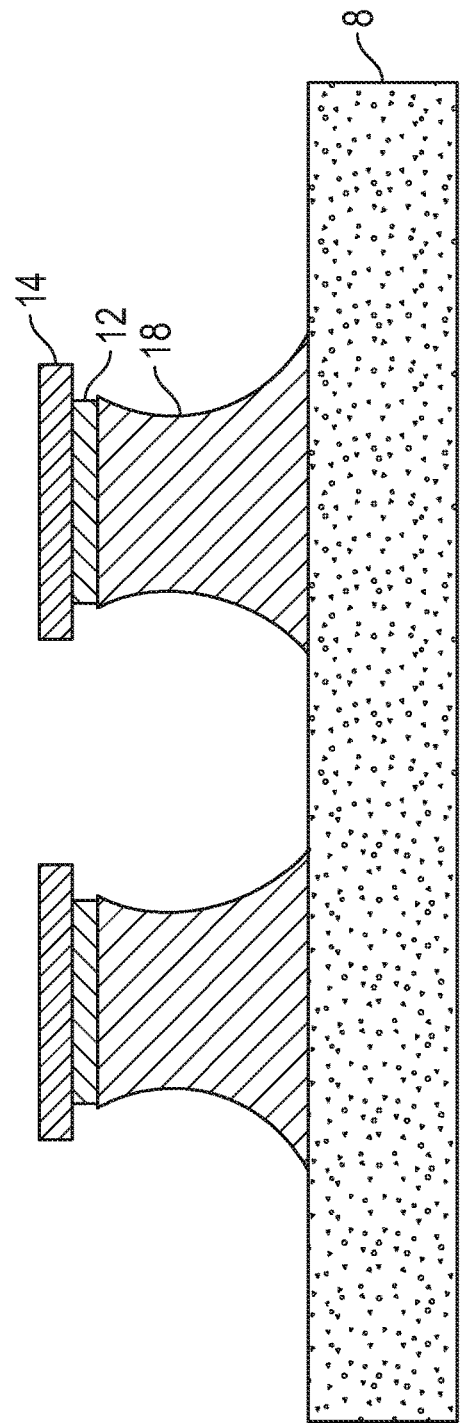
FIG. 8 illustrates a cross-sectional view of a semiconductor substrate after the layer of nickel has been etched showing how the layer does not substantially overhang the perimeter of each trace of a plurality of traces in the layer of copper following etching.

As illustrated in FIG. 8, the patterned layer 14 is illustrated coupled to the layer of nickel 12 following rinsing of the etchant from the substrate, where the nickel 12 is coupled to the traces 18 of copper. As illustrated, the traces 18 of copper are coupled to the dielectric layer 8. As illustrated, the layer of nickel 12 is now substantially coextensive with a perimeter of each trace 18 in the layer of copper. In such implementations, by non-limiting example, the perimeter of the layer of nickel 12 may be exactly coextensive with the perimeter of each trace 18 of copper, in others the perimeter may be less than exactly coextensive with the perimeter of each trace 18 of copper. Because the perimeter of the nickel layer 12 is substantially coextensive with the perimeter of the copper traces 18, during subsequent processing, solderability may be improved due to the nickel layer matching the size of the copper traces. In still other various implementations, the toughness of the semiconductor substrate against breakage may be increased.

Figure 9:
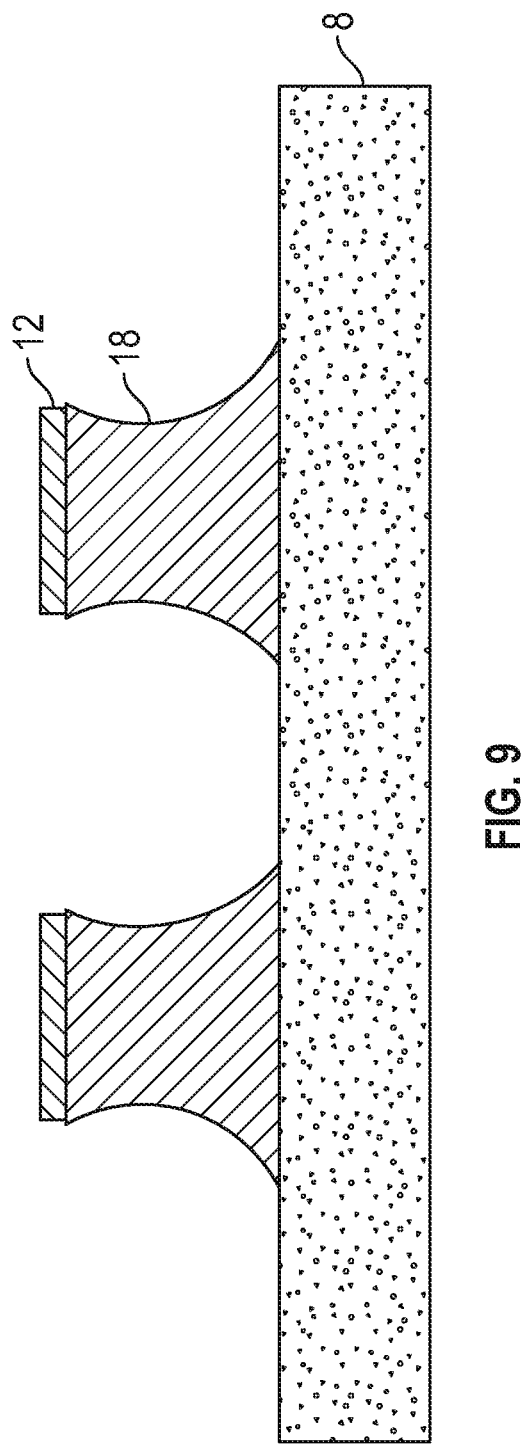
FIG. 9 illustrates a cross-sectional view of a semiconductor substrate after the patterned layer has been removed.

Referring to FIG. 9, a cross-sectional view of a semiconductor substrate after the patterned layer has been stripped is illustrated. In various implementations, the patterned layer may be stripped off of the layer of nickel 12 through, by non-limiting example, solvent stripping, etching, ashing, or any other removal technique. As illustrated, once the patterned layer is removed, the layer of nickel 12 remains coupled to the traces 18 of copper, which is coupled to the dielectric layer 8.

In places where the description above refers to particular implementations of etched nickel plated substrates and implementing components, sub-components, methods and sub-methods, it should be readily apparent that a number of modifications may be made without departing from the spirit thereof and that these implementations, implementing components, sub-components, methods and sub-methods may be applied to other etched nickel plated substrates.

What is claimed is:

1. A method of etching nickel on a substrate, comprising:
providing a dielectric layer;
coupling a layer of copper with a first side of the dielectric layer;
plating a first side of the layer of copper with a layer of nickel;
forming a patterned layer on the layer of nickel;
spray etching the layer of nickel using an etchant;
holding the etchant on the dielectric layer for a predetermined period of time; and
while holding the etchant, etching substantially only the layer of nickel until the layer of nickel is substantially coextensive with a perimeter of each of a plurality of traces in the layer of copper.

2. The method of claim 1, wherein the etchant comprises ferric chloride.

3. The method of claim 1, wherein the predetermined period of time is within a range of 60 seconds to 90 seconds.

4. The method of claim 1, wherein the layer of nickel comprises electroless nickel.

5. The method of claim 1, wherein the patterned layer is formed by screen printing, stenciling, or photolithographic processing.

6. The method of claim 1, wherein holding the etchant further comprises holding the etchant at a temperature within a range of 43 degrees Celsius to 47 degrees Celsius.

7. The method of claim 1, wherein spray etching the layer of nickel further comprises spraying the etchant at a pressure within a range of 220 kilopascals to 280 kilopascals.

8. The method of claim 1, wherein the layer of nickel has a thickness within a range of 1 micrometer to 7 micrometers, and the layer of copper has a thickness within a range of 70 micrometers to 1,000 micrometers.

9. The method of claim 1, further comprising removing the patterned layer.

10. A method of etching nickel on a substrate, comprising:
providing a dielectric layer;
coupling a layer of copper with a first side of the dielectric layer;
plating a first side of the layer of copper with a layer of nickel;
forming a patterned layer on the layer of nickel;
spray etching the layer of nickel using an etchant;
holding the etchant on the dielectric layer for a predetermined period of time, the predetermined period of time within a range of 60 seconds to 90 seconds; and
while holding the etchant, etching substantially only the layer of nickel until the layer of nickel is substantially coextensive with a perimeter of each of a plurality of traces in the layer of copper.

11. The method of claim 10, wherein the etchant comprises ferric chloride.

12. The method of claim 10, wherein the patterned layer is formed by screen printing, stenciling, or photolithographic processing.

13. The method of claim 10, wherein holding the etchant further comprises holding the etchant at a temperature within a range of 43 degrees Celsius to 47 degrees Celsius.

14. The method of claim 10, wherein spray etching the layer of nickel further comprises spraying the etchant at a pressure within a range of 220 kilopascals to 280 kilopascals.

15. The method of claim 10, wherein the layer of nickel has a thickness within a range of 1 micrometer to 7 micrometers, and the layer of copper has a thickness within a range of 70 micrometers to 1,000 micrometers.

* * * * *